US009882351B2

(12) United States Patent
Taylor et al.

(10) Patent No.: US 9,882,351 B2
(45) Date of Patent: Jan. 30, 2018

(54) LASER STRUCTURE (71) Applicant: The University Court of the University of Glasgow, Glasgow (GB)

(72) Inventors: Richard James Edward Taylor, Gainsborough (GB); David T. D. Childs, Hope Valley (GB); Richard Hogg, Sheffield (GB)

(73) Assignee: The University Court of the University of Glasgow (GB)

( * ) Notice: Subject to any disclaimer, the term of this patent is extended or adjusted under 35 U.S.C. 154(b) by 0 days.

(21) Appl. No.: 15/505,836

(22) PCT Filed: Aug. 21, 2015

(86) PCT No.: PCT/GB2015/052440
§ 371 (c)(1),
(2) Date: Feb. 22, 2017

(87) PCT Pub. No.: WO2016/027105
PCT Pub. Date: Feb. 25, 2016

(65) Prior Publication Data
US 2017/0271846 A1    Sep. 21, 2017

(30) Foreign Application Priority Data
Aug. 22, 2014 (GB) .................................. 1414984.3

(51) Int. Cl.
*H01S 5/00* (2006.01)
*H01S 5/10* (2006.01)
(Continued)

(52) U.S. Cl.
CPC .............. *H01S 5/105* (2013.01); *H01S 5/026* (2013.01); *H01S 5/02453* (2013.01);
(Continued)

(58) Field of Classification Search
CPC ...... H01S 5/105; H01S 5/02453; H01S 5/042; H01S 5/187; H01S 5/34366;
(Continued)

(56) References Cited

U.S. PATENT DOCUMENTS 6,975,664 B1 * 12/2005 Dodabalapur ........ H01S 3/0933
372/102
7,248,615 B2 * 7/2007 Assefa ................... B82Y 20/00
372/92

(Continued)

FOREIGN PATENT DOCUMENTS

EP       1501162 A2    1/2005
WO    2014/030361 A1    2/2014

OTHER PUBLICATIONS

International Search Report in PCT/GB2015/052440, dated Dec. 3, 2015, 4 pages.
(Continued)

*Primary Examiner* — Kinam Park
(74) *Attorney, Agent, or Firm* — Lerner, David, Littenberg, Krumholz & Mentlik, LLP (57) ABSTRACT A laser structure comprising a first photonic crystal surface emitting laser (PCSEL), a second PCSEL, and a coupling region that extends between the first PCSEL and the second PCSEL along a longitudinal axis and that is electrically controllable so as to be capable of coherently coupling the first PCSEL to the second PCSEL. Each PCSEL include an active layer, a photonic crystal, and a two-dimensional periodic array distributed in an array plane parallel to the longitudinal axis within the photonic crystal where the two-dimensional periodic array is formed of regions having a refractive index that is different to the surrounding photonic crystal.

20 Claims, 6 Drawing Sheets (51) Int. Cl.
*H01S 5/343* (2006.01)
*H01S 5/20* (2006.01)
*H01S 5/042* (2006.01)
*H01S 5/024* (2006.01)
*H01S 5/187* (2006.01)
*H01S 5/42* (2006.01)
*H01S 5/40* (2006.01)
*H01S 5/026* (2006.01)
*H01S 5/183* (2006.01)
*H01S 5/18* (2006.01)

(52) U.S. Cl.
CPC ............ *H01S 5/042* (2013.01); *H01S 5/1028* (2013.01); *H01S 5/187* (2013.01); *H01S 5/18319* (2013.01); *H01S 5/2031* (2013.01); *H01S 5/34366* (2013.01); *H01S 5/4012* (2013.01); *H01S 5/42* (2013.01); *H01S 5/18* (2013.01); *H01S 5/4075* (2013.01); *H01S 5/423* (2013.01)

(58) Field of Classification Search
CPC ...... H01S 5/4012; H01S 5/42; H01S 5/18319; H01S 5/18; H01S 5/4075; H01S 5/423; H01S 5/026; H01S 5/1028
See application file for complete search history.

(56) References Cited

U.S. PATENT DOCUMENTS

| | | |
|---|---|---|
| 2001/0026857 A1 | 10/2001 | Kinoshita |
| 2003/0169787 A1* | 9/2003 | Vurgaftman ............ B82Y 10/00 372/20 |
| 2006/0024013 A1* | 2/2006 | Magnusson ............ G02B 6/124 385/129 |
| 2008/0080579 A1* | 4/2008 | Scherer ................. B82Y 20/00 372/45.011 |

OTHER PUBLICATIONS

International Preliminary Report on Patentability for Application No. PCT/GB2015/052440 dated Feb. 28, 2017.

* cited by examiner

LASER STRUCTURE

CROSS REFERENCE TO REALATED APPLICATIONS

The present application is a national phase entry under 35 U.S.C. §371 of International Application No. PCT/GB2015/052440 filed Aug. 21, 2015, published in English, which claims priority from Application No. GB 1414984.3 filed Aug. 22, 2014, all of which are incorporated herein by reference.

This invention relates to an improved laser structure, and in particular to an improved laser structure that includes a coupling region, and methods for operating the improved laser structure.

BACKGROUND

Photonic crystals have opened up a new realm of possibilities within semiconductor optics. Photonic crystals include periodic dielectric structures that can be used to create nano-scale optical waveguides, light trapping nano-cavities, and may be combined with existing device structures to provide a unique set of properties. Through the introduction of a photonic crystal into a semiconductor laser, new properties are obtained including coherent oscillation, very low divergences (as low as 1 degree), beam steering, high power single mode operation, power scaling, and wavelength selectivity.

The generation of high single-mode powers is generally accomplished by increasing the area of a surface emitting laser. For devices utilizing a vertical cavity the area over which single-mode emission is obtained is limited to a few microns. For external cavity surface emitting lasers and photonic crystal surface emitting lasers (PCSELs) the area of the device which can support a single-mode is limited by difficulties in obtaining uniform current injection and heat extraction. Often in a circular device power scales linearly with diameter rather than area.

The present invention relates to an improved laser structure. Certain embodiments of the present invention provide improvements and/or benefits that go beyond prior art laser structures.

BRIEF SUMMARY OF THE DISCLOSURE

In accordance with a first aspect of the present invention there is provided a laser structure comprising:
a first photonic crystal surface emitting laser (PCSEL);
a second PCSEL; and
a coupling region that extends between the first PCSEL and the second PCSEL along a longitudinal axis and that is electrically controllable so as to be capable of coherently coupling the first PCSEL to the second PCSEL;
wherein each PCSEL includes:
an active layer;
a photonic crystal; and
a two-dimensional periodic array distributed in an array plane parallel to the longitudinal axis within the photonic crystal where the two-dimensional periodic array is formed of regions having a refractive index that is different to the surrounding photonic crystal.

Certain embodiments of the present invention overcome limitations associated with the prior art by coherently coupling two or more PCSEL devices. Among other applications, the coherent coupling of two or more PCSEL devices opens up the opportunity to perform beam steering of the optical wave-front.

Each PCSEL may include a pair of waveguide cladding layers, and wherein the active layer and photonic crystal of each PCSEL is disposed between the pair of waveguide cladding layers. One or more of the pair of waveguide cladding layers may include one or more distributed Bragg reflectors (DBRs) wherein the one or more DBRs is positioned such that it is in phase with scattered emission from the photonic crystal. In certain embodiments, two or more types of DBRs may be included. For example, one or more planar DBRs may be positioned underneath or above the plane of the PCSEL, and/or one or more DBRs may be positioned in the PCSEL plane surrounding the PCSEL.

The waveguide cladding layers may comprise a material having a lower refractive index relative to layers of material intermediate the pair of waveguide cladding layers.

In certain embodiments, the active layer may be bulk, quantum wells and/or quantum dots. The active layer may include one or more of InGaAs/GaAs quantum wells, InAs/GaAs quantum dots, GaAs/AlGaAs quantum wells, and AlInGaAsP quantum wells.

The photonic crystal may comprise any suitable semiconductor laser material. The photonic crystal may comprise one or more of GaAs, AlGaAs, GaInP, InGaAs, GaInAsP, AlInGaAs, and AlInGaN, for example.

In some embodiments, the periodic array may be formed of voids in the photonic crystal. The voids may or may not be vacuum. For example, the voids may include gases. Such gases may arise from the growth of the PCSEL structure.

In alternative embodiments, the periodic array may be formed of regions of material having a different refractive index relative to the surrounding photonic crystal.

The periodic array may have a first periodicity along a first direction that is substantially equal to a second periodicity along a second direction that is orthogonal to the first direction, where each of the first and second directions lie along the array plane. Whilst the two dimensional periodic array may indeed be necessary over a large part of the PCSEL, the periodic array may be stretched or shrunk around its edges so as to limit light escape along the array plane.

The two-dimensional periodic array may be a first two-dimensional periodic array, the array plane may be a first array plane and the one or more of the PCSELs may include one or more additional two-dimensional periodic arrays distributed in a photonic crystal in an additional array plane that is parallel to the first array plane.

The one or more additional two-dimensional periodic array may have a different periodicity to the periodicity of the first two-dimensional periodic array. The additional two-dimensional periodic array may have a first periodicity along a first direction that is substantially equal to a second periodicity along a second direction that is orthogonal to the first direction, where each of the first and second directions lie along the additional array plane. In certain embodiments, the one or more additional two-dimensional periodic array may be independent of or registered to the first two-dimensional periodic array (i.e. the crystals may line up, be twisted or be shifted in the array plane relative to each other).

The coupling region may have a modal refractive index that differs from the modal refractive index of the first and second PCSELs by no more than 25%, optionally by no more than 15%, and optionally by no more than 5%.

The coupling region may be electrically drivable so that an applied current alters the gain or the loss of the coupling region. The coupling region may comprise electrodes for applying an electrical current across the coupling region. In other embodiments, the coupling region may be electrically drivable so that an electric field alters the gain or the loss of the coupling region. For example, a voltage may be applied to create an electric field which may then alter the refractive index or loss of the coupling region.

The first and second PCSELs may comprise electrodes for applying an electrical current across the first and second PCSELs.

The laser structure may further comprise heating apparatus for heating the coupling region. The heating apparatus may be configured to heat the coupling region by application of an electrical current or voltage. The coupling region may be passive such that there is substantially no absorption or gain at wavelengths corresponding to emitted wavelengths of the active layer of the first and second PCSEL.

The laser structure may further comprise one or more PCSELs coupled to the first PCSEL and/or second PCSEL by a second or further electrically controllable coupling region.

In any embodiment, the PCSELs may be substantially identical to one another. In other embodiments, the PCSELs may differ from one another.

The laser structure may further comprise an optical arrangement for collecting light emitted from the PCSELs. The optical arrangement may be further configured to spatially combine light collected from multiple ones of the PCSELs.

In accordance with a second aspect of the present invention there is provided a method of operating a laser structure, comprising:
  providing a laser structure according to the first aspect of the present invention;
  applying an electrical current to one or more of the PCSELs to operate the one or more PCSELs above their respective lasing thresholds;
  electrically controlling the coupler region so as to alter the gain and/or phase of the coupler region and coherently couple one or more of the PCSELs; and
  collecting light emitted from the PCSELs.

The method may further comprise spatially combining the collected light.

The step of electrically controlling the coupler region may comprise applying an electric current to the coupling region. Additionally or alternatively, the step of electrically controlling the coupler region may comprise heating the coupling region.

BRIEF DESCRIPTION OF THE DRAWINGS

Embodiments of the invention are further described hereinafter with reference to the accompanying drawings, in which.

DETAILED DESCRIPTION

Figure 1:
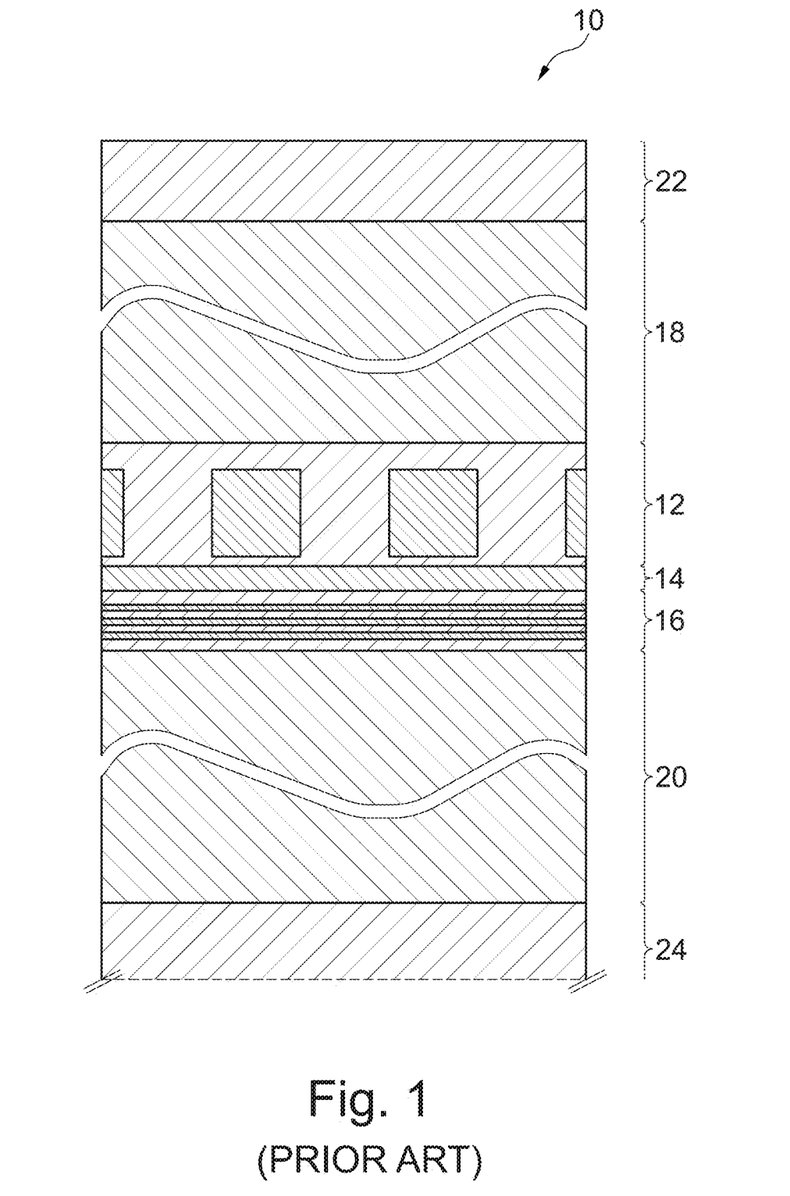
FIG. 1 is a schematic cross-sectional view of a known photonic crystal surface emitting laser (PCSEL)

FIG. 1 shows an example of a known photonic crystal surface emitting laser (PCSEL) 10. The PCSEL 10 includes a photonic crystal 12 and an active layer 16 disposed between a pair of waveguide cladding layers. In the example shown in FIG. 1, the PCSEL additionally includes an etch stop layer 14 between the photonic crystal 12 and the active layer 16. In some known PCSELs, the one or both of the pair of waveguide cladding layers include one or more distributed Bragg reflectors (DBRs). The waveguide cladding layers may include a P cladding layer 18 adjacent to the photonic crystal 12, an n cladding layer 20 adjacent to the active layer 16, a P+ cladding layer 22 adjacent to the P cladding layer 18, and a n+ cladding layer adjacent to the n cladding layer 20. The photonic crystal 12 defines a periodic array with volumes having a different refractive index to the surrounding photonic crystal 12. Such volumes may be formed by a different material to the surrounding photonic crystal 12 or voids in the photonic crystal 12. The photonic crystal 12 may include any suitable semiconductor laser material. On GaAs substrate typical suitable materials include GaAs, AlGaAs, GaInP, InGaAs, though all alloys are possible. For InP based devices GaInAsP and AlInGaAs alloys are common. For GaN based devices, AlInGaN alloys are common. The additional material is any material which has a refractive index difference. The active layer 16 may be any suitable active layer capable of permitting and sustaining lasing. For example, the active layer 16 may be bulk, or a region that includes quantum wells (e.g. multiple quantum wells (MQWs)) and/or quantum dots. Suitable materials for the active layer 16 include, but are not limited to, InGaAs/GaAs quantum wells, InAs/GaAs, quantum dots, GaAs/AlGaAs quantum wells, and AlInGaAsP quantum wells.

Figure 2:
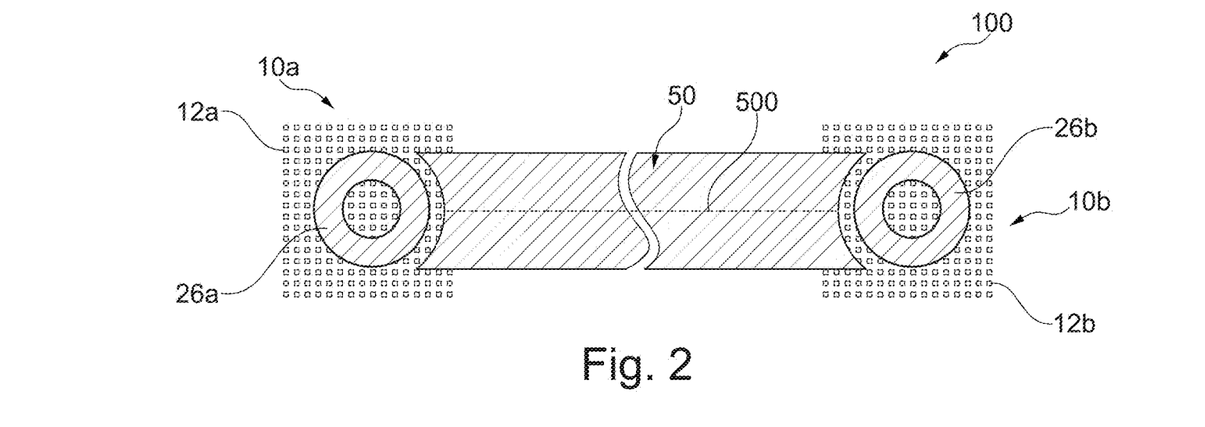
FIG. 2 is a schematic top-down view of a laser structure in accordance with an embodiment of the present invention.
Figure 3:
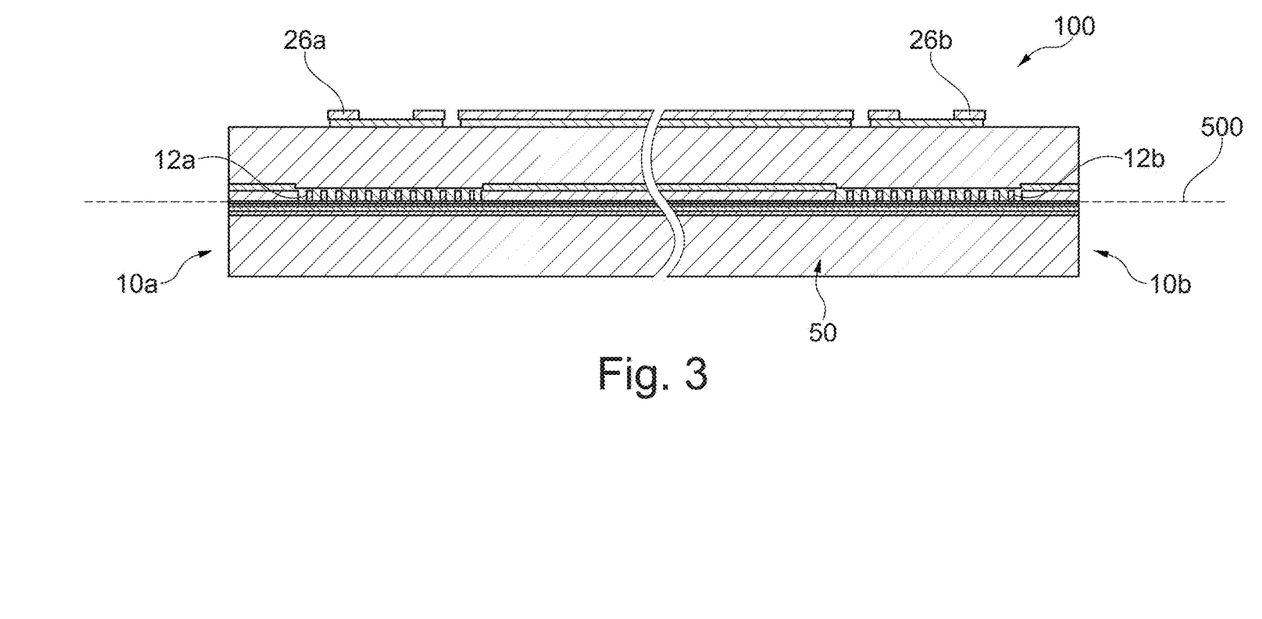
FIG. 3 is a schematic cross-sectional view of a laser structure in accordance with an embodiment of the present invention.

FIGS. 2 and 3 show a laser structure 100 in accordance with an embodiment of the present invention, where FIG. 2 shows a top down view and FIG. 3 shows a cross-sectional side view of the laser structure 100. The laser structure 100 includes a first PCSEL 10a and a second PCSEL 10b that are coupled to one another by a coupling region 50. The first and second PCSELs may each be as described above in relation to FIG. 1, or they may each be any other suitable PCSEL. The coupling region 50 extends between the first and second PCSELs 10a, 10b along a longitudinal axis 500 that is parallel to an array plane where the periodic arrays of the photonic crystals 12a, 12b are formed. The periodic arrays of the photonic crystals 12a, 12b are overlaid in the image shown in FIG. 2 to aid the reader's understanding.

In accordance with embodiments of the present invention, the periodic arrays of the photonic crystals 12a, 12b are two-dimensional periodic arrays extending in the array plane. Each periodic array may have a first periodicity along a first direction in the array plane and a second periodicity that is equal to the first periodicity along a second direction in the array plane that is orthogonal to the first direction. In other embodiments, the first periodicity may differ to the second periodicity. Whilst the two dimensional periodic array may indeed be necessary over a large part of the PCSEL, the periodic array may be stretched or shrunk around its edges so as to limit light escape along the array plane.

In the embodiment shown in FIGS. 2 and 3, the coupling region 50 is made up of layers corresponding to the layers of the first and second PCSELs 10a, 10b with the exception of the periodic array in the photonic crystal 12. In alternative embodiments, other structures and/or materials may form the coupling region 50. In certain preferable embodiments, the coupling region 50 is selected so as to have a small modal refractive index change relative to the PCSELs 10a, 10b that it couples. In particular embodiments, the coupling region 50 has a modal refractive index that differs from the modal refractive index of the first and second PCSELs 10a, 10b by no more than 25%, by no more than 15%, or by no more than 5%. In certain embodiments, the coupling region 50 has a modal refractive index that is substantially equal to the modal refractive index of the first and second PCSELs 10a, 10b.

The coupling region 50 is electrically controllable so as to be capable of coherently coupling the first PCSEL 10a to the second PCSEL 10b. Electrical control may be achieved by altering or modulating the gain or loss of the coupling region 50 and/or the phase of the coupling region 50 relative to the phase of emission of the PCSELs 10a, 10b.

In certain embodiments, electrical control is achieved by electrically driving the coupling region 50 by application of an electric current across the coupling region 50. Electrical driving of the coupling region 50 alters the gain of the coupling region 50 and thereby controls the coupling of the PCSELs 10a, 10b. To facilitate electrical driving of the coupling region 50, the coupling region 50 may include electrodes for applying an electrical current across the coupling region 50. For example, the electrodes may be placed on an upper and lower surface, respectively, of the coupling region 50 so as to be capable of applying an electrical current across the coupling region 50. In other embodiments, the coupling region may be electrically drivable so that an electric field alters the gain or the loss of the coupling region. For example, a voltage may be applied to create an electric field which may then alter the refractive index or loss of the coupling region. In other embodiments electrical control of the coupling region 50 may be achieved by other means so as to coherently couple the PCSELs 10a, 10b. For example, the coupling region 50 may be heated so as to alter the phase of the coupling region 50 relative to the phase of emission the PCSELs 10a, 10b. Heating apparatus may be provided to achieve the required heating. The heating may be achieved by application of an electrical current or voltage. In embodiments where heat is used to electrically control the coupling region 50, it may be preferable for the coupling region to not be a structure that is not a p-n junction structure (which is indeed be preferable for embodiments where the coupling region is controllable by electrically driving the coupling region with an electric current).

Being lasers, each of the first PCSEL 10a and the second PCSEL 10b has a lasing threshold current and an emission wavelength. In preferable embodiments, the first PCSEL 10a and the second PCSEL 10b are substantially identical to one another such that they each have the same lasing threshold current and emission wavelength. In the embodiment shown in FIGS. 2 and 3, the first PCSEL 10a has a first electrode 26a for supplying electrical current to the first PCSEL 10a, and the second PCSEL 10b has a second electrode 26b for supplying electrical current to the second PCSEL 10b.

Certain effects and advantages of the present invention are highlighted by consideration of the various modes of operation described below in relation to FIGS. 4 to 9.

Figure 4A:
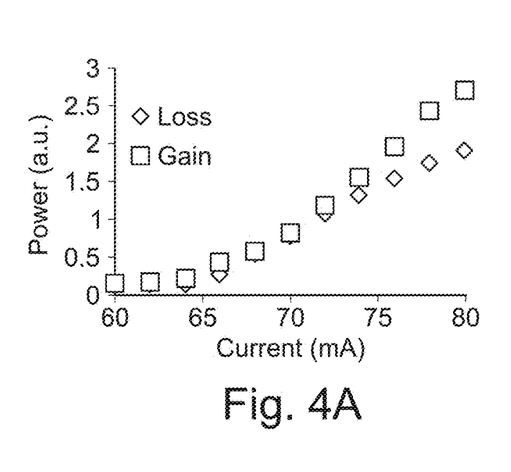
FIG. 4A shows a plot of power measured from a first PCSEL of a laser structure in accordance with an embodiment of the present invention (and shown in FIG. 5A) as a function of current supplied to the first PCSEL.
Figure 4B:
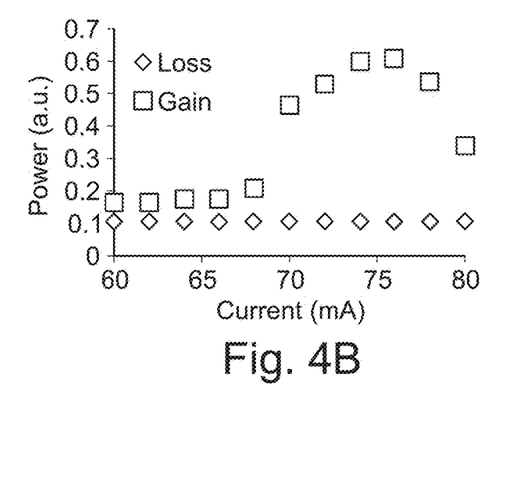
FIG. 4B shows a plot of power measured from a first PCSEL of a laser structure in accordance with an embodiment of the present invention (and shown in FIG. 5B) as a function of current supplied to a second PCSEL of the laser structure.

FIGS. 4A and 4B show plots of the power collected from the laser structure 100 as a function of supplied current. In particular, the results shown in FIG. 4A correspond to a laser structure 100 in the configuration shown in FIG. 5A, and the results shown in FIG. 4B correspond to a laser structure 100 in the configuration shown in FIG. 5B.

Figure 5A:
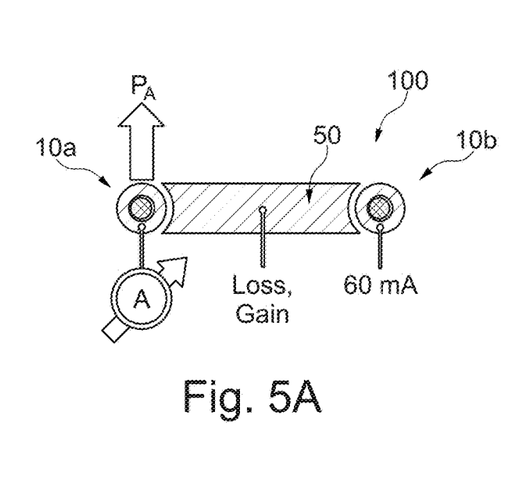
FIG. 5A shows a laser structure in accordance with an embodiment of the present invention configured to obtain the results shown in FIG. 4A.

In the configuration shown in FIG. 5A, the power output PA from the first PCSEL 10a is measured as a function of current supplied to the first PCSEL 10a. Simultaneously, a constant current of 60 mA is applied to the second PCSEL 10b. In the specific embodiment of FIG. 5A, the lasing threshold current of the second PCSEL 10b is around 65 mA so the current supplied to the second PCSEL 10b is below the lasing threshold current. The measurement of power output PA is performed with the coupling region 50 operating in gain (e.g. when an electrical current is supplied to the coupling region 50) and, separately, with the coupling region 50 operating in loss (e.g. when no electrical current is supplied to the coupling region 50).

The results shown in FIG. 4A reveal that a difference in measured power is observed when the coupling region 50 is operated in gain in contrast to when it is operated in loss. The additional observed power may be attributed to the additional power from the sub-threshold second PCSEL 10b.

Figure 5B:
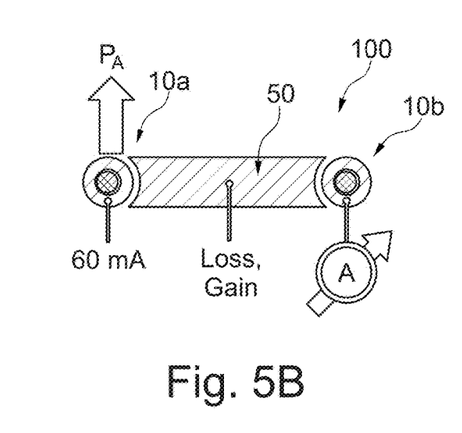
FIG. 5B shows a laser structure in accordance with an embodiment of the present invention configured to obtain the results shown in FIG. 4B.
Figure 6A:
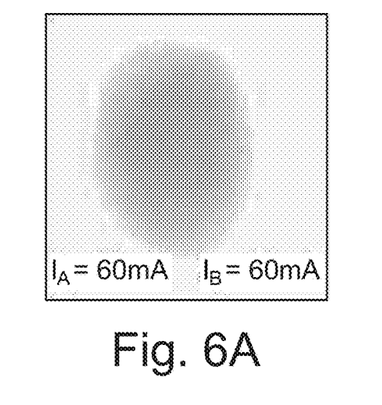
FIG. 6A shows an image of the collected and combined emission from a pair of PCSELs coupled to one another as part of a laser structure in accordance with the present invention (and shown in FIG. 7), where the pair of PCSELs are operated below threshold with the coupler in loss.
Figure 6B:
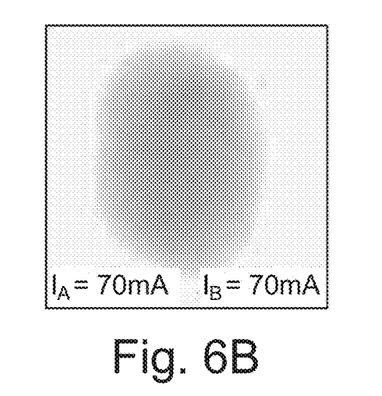
FIG. 6B shows an image of the collected and combined emission from a pair of PCSELs coupled to one another as part of a laser structure in accordance with the present invention (and shown in FIG. 7), where the pair of PCSELs are operated above threshold with the coupler in loss.
Figure 7:
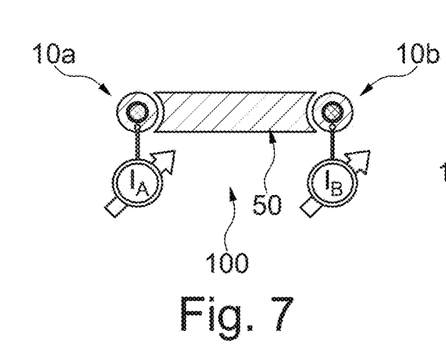
FIG. 7 shows a laser structure in accordance with an embodiment of the present invention configured to obtain the results shown in FIGS. 6A and 6B.

In the configuration shown in FIG. 5B, the power output PA from the first PCSEL 10a is measured as a function of current supplied to the second PCSEL 10b. Simultaneously, a constant current of 60 mA is applied to the first PCSEL 10a. In the specific embodiment of FIG. 5B, the lasing threshold current of the first PCSEL 10*a* is around 65 mA so the current supplied to the first PCSEL 10*a* is below the lasing threshold current. The measurement of power output PA is performed with the coupling region 50 operating in gain (e.g. when an electrical current is supplied to the coupling region 50) and, separately, with the coupling region 50 operating in loss (e.g. when no electrical current is supplied to the coupling region 50).

The results shown in FIG. 4B reveal that a difference in measured power is observed when the coupling region 50 is operated in gain in contrast to when it is operated in loss. With the coupling region 50 operating in loss, there is no variation in the power output of the first PCSEL 10*a* despite the current supplied to the second PCSEL 10*b* being increased. This may be attributed to the coupling region 50 being incapable of coupling the first and second PCSELs 10*a*, 10*b* when operating in loss. When the coupling region 50 is operated in gain, there is a noticeable rise in observed power output from the first PCSEL 10*a* when the current supplied to the second PCSEL 10*b* is increased above the lasing threshold current of the second PCSEL 10*b*. This effect is due to the coupling region 50 coupling the first and second PCSELs 10*a*, 10*b* such that when the second PCSEL 10*b* is driven above its lasing threshold current, the second PCSEL 10*b* contributes to the power output observed from the first PCSEL 10*a*. It is important to note that lasing was not observed by driving the coupling region 50 alone eliminating the possibility that the coupling region 50 itself contributes to increased power observed.

The results shown in FIGS. 4A and 4B demonstrate that the transfer of optical power between PCSELs may be controlled by electrical manipulation of the coupling region coupling the PCSELs. In accordance with certain embodiments, the coupling region may be additionally or alternatively be manipulated electronically by heating the coupling region. Heating the coupling region has the effect of altering its electrical properties and thereby provides a further mechanism for electrically controlling the transfer of optical power between PCSELs. In certain embodiments, the coupling region may be heated by the application of an electric current. In alternative embodiments, the coupling region may be heated by the application of direct heat.

In certain embodiments, the coupling region may be passive (i.e. not include an active region) and be controllable by the application of heat. By being passive, there will be substantially no absorption or gain at wavelengths corresponding to emitted wavelengths of the active layer of the PCSELs.

FIGS. 6A, 6B, 8A and 8B provide further demonstrations of the effects of coupling multiple PCSELs where separate beams from the PCSELs are combined in order to demonstrate coherence between the PCSEL emitters. In particular, FIGS. 6A and 6B relate to the configuration of laser structure 100 shown in FIG. 7 and show images of collected and combined beams emitted by the first PCSEL 10*a* and second PCSEL 10*b* with the coupling region 50 operating in loss but close to transparency (at 210 mA). The image of FIG. 6A was taken with each of the first and second PCSELs operating at 60 mA which is below the respective lasing threshold currents of the first and second PCSELs 10*a*, 10*b*. The image of FIG. 6B was taken with each of the first and second PCSELs 10*a*, 10*b* operating at 70 mA which is above the respective lasing threshold currents of the first and second PCSELs 10*a*, 10*b*. A comparison of the images of FIGS. 6A and 6B reveals that operating the first and second PCSELs 10*a*, 10*b* above their lasing threshold current results in a slightly brighter image. However, neither image provides evidence of coherent coupling of the first and second PCSELs 10*a*, 10*b*.

Figure 8A:
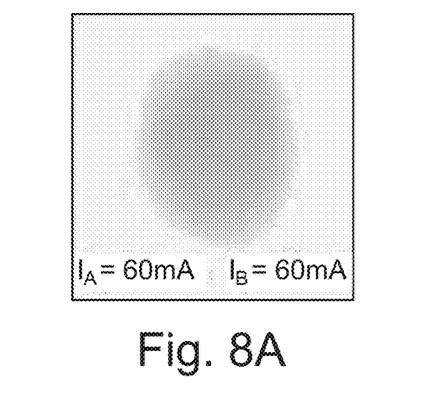
FIG. 8A shows an image of the collected and combined emission from a pair of PCSELs coupled to one another as part of a laser structure in accordance with the present invention (as shown in FIG. 9), where the pair of PCSELs are operated below threshold with the coupler in gain.
Figure 8B:
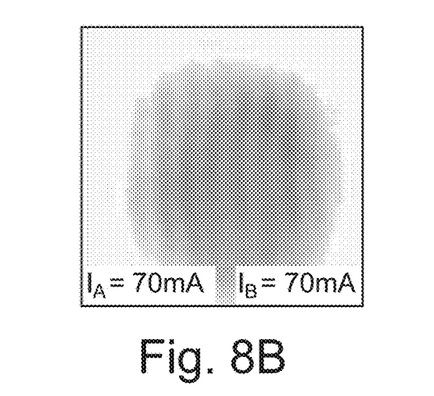
FIG. 8B shows an image of the collected and combined emission from a pair of PCSELs coupled to one another as part of a laser structure in accordance with the present invention (as shown in FIG. 9), where the pair of PCSELs are operated above threshold with the coupler in gain.
Figure 9:
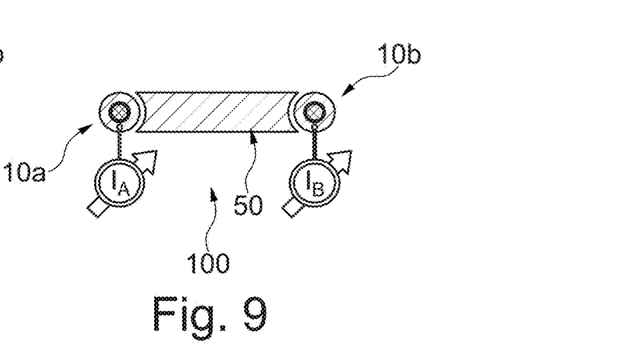
FIG. 9 shows a laser structure in accordance with an embodiment of the present invention configured to obtain the results shown in FIGS. 8A and 8B.

FIGS. 8A and 8B relate to the configuration of laser structure 100 shown in FIG. 9 and show images of collected and combined beams emitted by the first PCSEL 10*a* and second PCSEL 10*b* with the coupling region 50 operating in gain but close to transparency (at 220 mA). The image of FIG. 8A was taken with each of the first and second PCSELs operating at 60 mA which is below the respective lasing threshold currents of the first and second PCSELs 10*a*, 10*b*. The image of FIG. 8B was taken with each of the first and second PCSELs 10*a*, 10*b* operating at 70 mA which is above the respective lasing threshold currents of the first and second PCSELs 10*a*, 10*b*. A comparison of the images of FIGS. 8A and 8B reveals that operating the first and second PCSELs 10*a*, 10*b* above their lasing threshold current results in a clear interference pattern demonstrating that the first and second PCSELs 10*a*, 10*b* are coherently coupled to one another, and, further, that the coherent coupling is controllable by manipulation of the coupling region 50 (i.e. switching the coupling region 50 from operating in loss to operating in gain).

It should be noted that the angle between beams emitted from the first and second PCSELs 10*a*, 10*b* was 2 degrees in the configurations used to obtain the images of FIGS. 6A, 6B, 8A and 8B. At a relative angle of 2 degrees, coherent light beams would be expected to produce interference fringes with a spacing of 27 µm. The pattern shown in FIG. 8B matches this predicted spacing thereby providing further support to the assertion that the pattern shown in FIG. 8B is due to coherent coupling of the first and second PCSELs 10*a*, 10*b* when the coupling region 50 is operated in gain.

Figure 10:
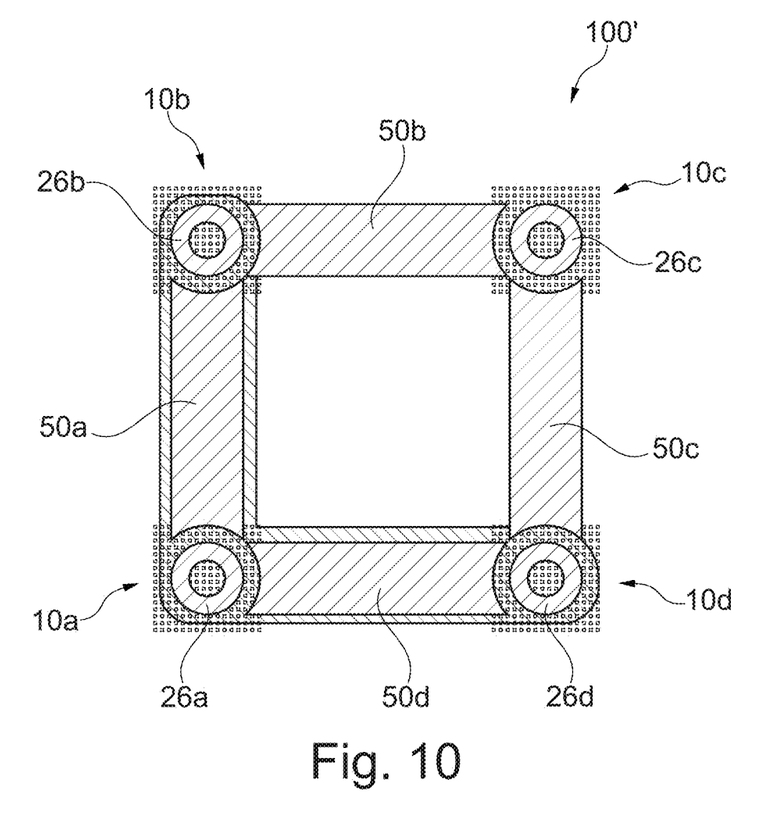
FIG. 10 shows a laser structure in accordance with an alternative embodiment of the present invention.

FIG. 10 provides an example of other possible embodiments within the scope of the present invention. In particular, FIG. 10 shows a laser structure 100' that includes four PCSELs 10*a*, 10*b*, 10*c*, 10*d* that are arranged on the corners of a notional square in relation to one another. Each of the PCSELs 10*a*, 10*b*, 10*c*, 10*d* is coupled to two other PCSELs 10*a*, 10*b*, 10*c*, 10*d* by coupling regions 50*a*,50*b*,50*c*,50*d*. By selectively operating the PCSELs 10*a*, 10*b*, 10*c*, 10*d* above their lasing threshold currents and selectively electrically driving the coupling regions 50*a*,50*b*,50*c*,50*d*, the PCSELs 10*a*, 10*b*, 10*c*, 10*d* may be controllably coherently coupled. In alternative embodiments of the present invention, any suitable number of PCSELs may be coupled to one another by coupling regions, where the PCSELs may be substantially identical or different to one another. This coupling between any (and up to arbitrarily large) number of PCSEL emitters in plane enables wide scale coherent emission and therefore single mode power scaling up to high powers.

Figure 11A:
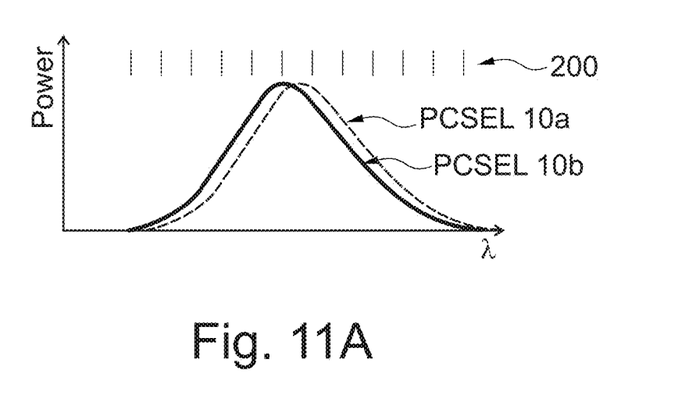
FIGS. 11A and 11B each show the emission spectra for a pair of PCSELs coupled to one another as part of a laser structure in accordance with embodiments of the present invention, where FIG. 11A relates to an embodiment where the coupling region is long, and FIG. 11B relates to an embodiment where the coupling region is short.
Figure 11B:
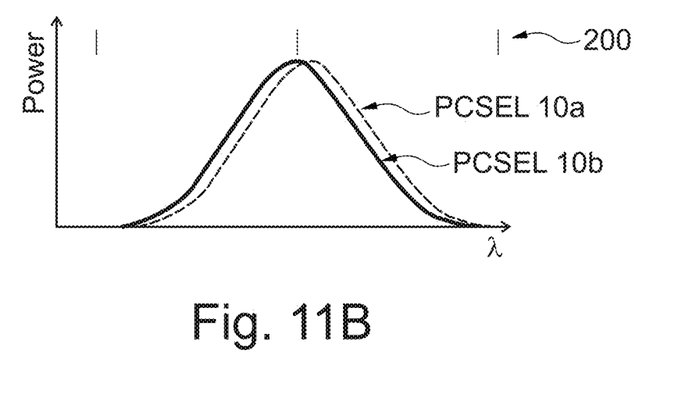

The coupling of two PCSELs may occur when the laser emission peaks of the two PCSELs are spectrally overlapped with one another. If the coupling region is sufficiently lossy then no coupling may occur. If the coupling region is passive or is active and driven beyond transparency, then coupling may occur. An additional requirement is that the emission from the two PCSELs should be in phase with one another. This is shown schematically in FIG. 11A for the case of a long coupling region (small wavelength separation of the phase matching conditions—as compared to the lasing linewidth), and in FIG. 11B for the case of a short coupling region (large wavelength separation of the phase matching conditions—as compared to the lasing linewidth). In particular, each of FIGS. 11A and 11B shows the emission spectra for a first PCSEL 10*a* and a second PCSEL 10*b* that are coupled by a coupling region (e.g. as described above in relation to FIGS. 2 and 3). The vertical lines 200 in each of FIGS. 11A and 11B indicate wavelengths at which the phase condition is matched (i.e. nL=mλ, where n is the refractive index of the coupling region, L is the length of the coupling region, m is the order, and λ is the wavelength in vacuum).

In embodiments with a "long coupling region" (e.g. as shown in FIG. 11A) phase matching occurs at a number of wavelengths within the lasing linewidth when the two PCSELs emit at the same wavelength. In embodiments such as this, a coupling region with an active element (e.g. quantum wells) at the same wavelength as the PCSELs may be controlled by application of an electrical current so as to control the loss and gain of the coupling region. In in embodiments with a "short coupling region" (e.g. as shown in FIG. 11B) more care is needed to tune the coupler to ensure phase matching. In particular, the phase of the coupling region may be matched to that of the PCSELs by controlling the number of free carriers and temperature of the coupling region. In such embodiments the coupling region may be passive as described above.

In certain embodiments of the invention, an optical arrangement may be provided for collecting light emitted by the PCSELs. The optical arrangement may spatially combine light collected from multiple ones of the PCSELs. In certain embodiments, the optical arrangement may include one or more lenses, and/or may include one or more refractive, reflective or diffractive elements.

Embodiments of the present invention provide a laser structure that is capable of controlled coherent coupling between multiple PCSELs. Such devices may offer better reliability, manufacturability and a significantly high coupling coefficient in comparison with prior art devices. Certain embodiments of the present invention are particularly suitable for devices in which wavelength control, power scaling, polarization control, single mode operation and/or beam steering is required. A notable advantage associated with embodiments of the present invention is that higher power and brightness may be obtained in comparison with prior art devices such as coupled distributed Bragg reflectors (DBRs). In addition to advantages in power scaling of the source, multiple coherent sources may be used to create electronically controllable interference patterns (for lithography, microfluidic cell sorting, optical tweezers). Furthermore, engineering a photonic band-structure which a broader divergence and positioning the PCSELs in closer proximity to one another allows electronically controlled beam steering.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A laser structure comprising:
   a first photonic crystal surface emitting laser (PCSEL);
   a second PCSEL; and
   a coupling region that extends between the first PCSEL and the second PCSEL along a longitudinal axis and that is electrically controllable so as to be capable of coherently coupling the first PCSEL to the second PCSEL;
   wherein each PCSEL includes:
   an active layer;
   a photonic crystal; and
   a two-dimensional periodic array distributed in an array plane parallel to the longitudinal axis within the photonic crystal where the two-dimensional periodic array is formed of regions having a refractive index that is different to the surrounding photonic crystal.

2. The laser structure of claim 1, wherein each PCSEL includes a pair of waveguide cladding layers, and wherein the active layer and photonic crystal of each PCSEL is disposed between the pair of waveguide cladding layers.

3. The laser structure of claim 2, wherein one or more of the pair of waveguide cladding layers includes one or more distributed Bragg reflectors (DBRs) wherein the one or more DBRs is positioned such that it is in phase with scattered emission from the photonic crystal.

4. The laser structure of claim 2, wherein the waveguide cladding layers comprise a material having a lower refractive index relative to layers of material intermediate the pair of waveguide cladding layers.

5. The laser structure of claim 1, wherein the active layer includes quantum wells and/or quantum dots, and optionally includes one or more of InGaAs/GaAs quantum wells, InAs/GaAs quantum dots, GaAs/AlGaAs quantum wells, and AlInGaAsP quantum wells.

6. The laser structure of claim 1, wherein the photonic crystal comprises any suitable semiconductor laser material, and optionally comprises one or more of GaAs, AlGaAs, GaInP, InGaAs, GaInAsP, AlInGaAs, and AlInGaN.

7. The laser structure of claim 1, wherein the periodic array is formed of voids in the photonic crystal, or wherein the periodic array is formed of regions of material having a different refractive index relative to the surrounding photonic crystal.

8. The laser structure of claim 1, wherein the periodic array has a first periodicity along a first direction that is substantially equal to a second periodicity along a second direction that is orthogonal to the first direction, where each of the first and second directions lie along the array plane.

9. The laser structure of claim 1, wherein the two-dimensional periodic array is a first two-dimensional periodic array, the array plane is a first array plane and the one or more of the PCSELs includes one or more additional two-dimensional periodic arrays distributed in a photonic crystal in an additional array plane that is parallel to the first array plane, optionally wherein the one or more additional two-dimensional periodic array has a different periodicity to the periodicity of the first two-dimensional periodic array.

10. The laser structure of claim 9, wherein the additional two-dimensional periodic array has a first periodicity along a first direction that is substantially equal to a second periodicity along a second direction that is orthogonal to the first direction, where each of the first and second directions lie along the additional array plane.

11. The laser structure of claim 1, wherein the coupling region has a modal refractive index that differs from the modal refractive index of the first and second PCSELs by no more than 25%, optionally by no more than 15%, and optionally by no more than 5%.

12. The laser structure of claim 1, wherein the coupling region is electrically drivable so that an applied current or an applied electric field alters the gain of the coupling region, optionally wherein the coupling region comprises electrodes for applying an electrical current or a voltage across the coupling region.

13. The laser structure of claim 1, wherein the first and second PCSELs comprise electrodes for applying an electrical current across the first and second PCSELs.

14. The laser structure of claim 1, further comprising heating apparatus for heating the coupling region, optionally wherein the heating apparatus is configured to heat the coupling region by application of an electrical current or voltage.

15. The laser structure of claim 14, wherein the coupling region is passive such that there is substantially no absorption or gain at wavelengths corresponding to emitted wavelengths of the active layer of the first and second PCSEL.

16. The laser structure of claim 1, further comprising one or more PCSELs coupled to the first PCSEL and/or second PCSEL by a second or further electrically controllable coupling region.

17. The laser structure of claim 1, further comprising an optical arrangement for collecting light emitted from the PCSELs, optionally wherein the optical arrangement is further configured to spatially combine light collected from multiple ones of the PCSELs.

18. A method of operating a laser structure, comprising:
providing a laser structure according to claim 1;
applying an electrical current to one or more of the PCSELs to operate the one or more PCSELs above their respective lasing thresholds;
electrically controlling the coupler region so as to alter the gain, and/or loss, and/or phase of the coupler region and coherently couple one or more of the PCSELs; and
collecting light emitted from the PCSELs.

19. The method of claim 18, further comprising spatially combining the collected light.

20. The method of claim 18, wherein the step of electrically controlling the coupler region comprises applying an electric current to the coupling region, or wherein the step of electrically controlling the coupler region comprises heating the coupling region.

* * * * *